US005773398A

United States Patent [19]

Joye et al.

[11] Patent Number: 5,773,398
[45] Date of Patent: Jun. 30, 1998

[54] CLEANING COMPOSITION BASED ON AN ALIPHATIC HYDROCARBON COMPOUND COMPRISING AT LEAST TWO AROMATIC SUBSTITUENTS

[75] Inventors: Jean-Luc Joye, Paris; Marie-Madeleine Vincent, Athis Mons, both of France

[73] Assignee: Rhone-Poulenc Chimie, Courbevoie, France

[21] Appl. No.: 681,748

[22] Filed: Jul. 29, 1996

[51] Int. Cl.$^6$ ................................. C11D 3/18; C11D 1/86
[52] U.S. Cl. .......................... 510/245; 510/202; 510/203; 510/219
[58] Field of Search .............................. 252/364; 510/202, 510/203, 206, 245, 254, 219; 134/40, 38, 42

[56] References Cited

U.S. PATENT DOCUMENTS

| | | | |
|---|---|---|---|
| 3,781,428 | 12/1973 | Hennart et al. | 424/219 |
| 4,120,810 | 10/1978 | Palmer | 252/153 |
| 4,560,723 | 12/1985 | Miller et al. | 524/486 |
| 5,006,279 | 4/1991 | Grobbel et al. | 252/542 |

FOREIGN PATENT DOCUMENTS

| | | |
|---|---|---|
| 0 355 763 | 2/1990 | European Pat. Off. . |
| 44 05 196 | 4/1995 | Germany . |
| 54 729 | 3/1991 | Hungary . |

*Primary Examiner*—John M. Ford
*Assistant Examiner*—Pavanaram K. Sripada
*Attorney, Agent, or Firm*—John Daniel Wood; John A. Shedden; Paul J. Juettner

[57] ABSTRACT

The present invention relates to a cleaning compound comprising, by volume:

1% to 99% of at least one compound (a) comprising a straight or branched hydrocarbon chain which is saturated or which has at least one unsaturation, and comprising at least two aryl or alkylaryl radicals, the aromatic nucleus of at least two aryl and/or alkylaryl radicals comprising 6 carbon atoms.

99% to 1% of at least one polar aprotic compound (b) which is at least partly soluble in water and in compound (a).

26 Claims, No Drawings

CLEANING COMPOSITION BASED ON AN ALIPHATIC HYDROCARBON COMPOUND COMPRISING AT LEAST TWO AROMATIC SUBSTITUENTS

The present invention is concerned with a composition which enables objects to be cleaned which have been soiled by oils or greases.

The first de-greasing compositions used were based on chlorinated solvent such as 1,1,1-trichloroethane (1.1.1.T) or on compounds of the chlorofluorocarbon (CFC) type. This type of solvent has a number of advantages, such as being effective and cheap. Furthermore, these compounds are light and therefore are easy to remove from the substrate which has just been treated. Another advantage is associated with the fact that they are inflammable which means that they can therefore be used for treating a substrate when hot.

However, cleaning compositions based on these solvents may cause environmental damage, more particularly to the ozone layer, and the Montreal protocol terminated the normal use of 1.1.1.T and CFC at the end of 1995. For this reason, it is important to find products to replace the solvents mentioned hereinabove.

The aim of the present invention is to propose a composition which is effective in cleaning any type of substrate and which can be used when hot and cold.

It therefore consists of a cleaning composition which comprises, by volume:

1% to 99% of at least one compound (a) having a straight or branched hydrocarbon chain which is saturated or which has at least one unsaturation, and comprising at least two aryl and/or alkylaryl radicals, the aromatic nucleus of at least two aryl and/or alkylaryl radicals comprising 6 carbon atoms, 99% to 1% of at least one polar aprotic compound (b) which is at least partly soluble in water and in compound (a).

The composition according to the invention has a number of advantages. In particular, it is inflammable which enables it to be used safely for treatments at relatively high temperatures.

Also, it has a very high degreasing strength and can be rinsed easily, that is to say simply by rinsing in water. This was not obvious since one of the compounds involved in the composition according to the invention is a heavy product, insoluble in water and therefore difficult to rinse.

Furthermore, the composition according to the invention has a high grease solubilisation strength which enables it to clean several parts.

Also, the composition according to the invention is stable over time.

However, other characteristics and advantages of the present invention will emerge more clearly from reading the following description and from the following examples.

The composition according to the invention thus contains at least one first compound, compound (a), which has an aliphatic hydrocarbon chain substituted by at least two radicals of the aryl and/or alkylaryl type.

More particularly, the aliphatic chain of the compound (a) comprises from 3 to 12 carbon atoms. Preferably, said chain has from 4 to 10 carbon atoms.

It should be explained that these values are given taking into consideration the longest hydrocarbon chain of the molecule, substituents excepted.

As stated, the aliphatic hydrocarbon chain of the compound (a) is substituted by at least two aryl and/or alkylaryl groups.

According to one particularly advantageous embodiment of the present invention, the aromatic nucleus of at least two aryl and/or alkylaryl radicals comprises 6 carbon atoms.

The alkyl part(s) of the alkylaryl radical(s) correspond preferably to a $C_1$–$C_4$ alkyl group. In such a case, the bond between the alkylaryl substituent and the hydrocarbon chain of compound (a) can take place by means of one of the carbon atoms of the alkyl part substituting said aromatic nucleus, or directly by one of the carbon atoms of the aromatic nucleus. According to a preferred variant of the invention, the bond is made by means of one of the carbon atoms of the aromatic nucleus.

One particularly advantageous embodiment of the invention consists in the use of a compound (a) comprising at least two substituents of the aryl type such as defined hereinabove, that is to say at least two of the aromatic nuclei of which have 6 carbon atoms. Preferably, the compound (a) comprises two aryl radicals, each of which comprises 6 carbon atoms.

The hydrocarbon aliphatic chain of the compound (a), in addition to the substituents of the afore-mentioned kind, can comprise other substituents such as alkyl radicals.

According to one particular embodiment, the alkyl radicals comprise 1 to 4 carbon atoms, the methyl group being preferred.

The compound (a) which is involved in the cleaning composition of the invention also has a saturated hydrocarbon chain or one comprising at least one unsaturation.

According to a first variant, said chain of compound (a) has at least one unsaturation. A particularly advantageous compound for implementation of this variant is 2,4-diphenyl-2-methyl pent-3-ene.

According to a second embodiment of the present invention, the compound (a) has a saturated hydrocarbon aliphatic chain. 2,4-diphenyl 2-methylpentane is preferably used as this type of compound.

Quite clearly, it would not be beyond the scope of the present invention to use a mixture of the afore-mentioned types of compound (a).

The second constituent of the composition according to the invention is constituted by a polar aprotic compound (b) which is at least partly soluble in water and in compound (a).

For a first category of compound (b), it is possible to cite $C_1$–$C_4$ dialkyl esters of at least one $C_4$–$C_6$ aliphatic di-acid.

The mixture of di-acid esters consists of esters which are derived essentially from glutaric and succinic adipic acids, the alkyl groups of the ester part being selected in particular from the methyl and ethyl groups, but also being able to be propyl, isopropyl, butyl, n-butyl and isobutyl.

As stated hereinabove, the $C_4$ to $C_6$ di-acids above are actually by-products from the preparation of adipic acid which is one of the main monomers of the polyamides, and the dialkyl esters are obtained by the esterification of the by-product which usually contains 15% to 30%, by weight, of succinic acid, 50% to 75% of glutaric acid, and 5% to 25% of adipic acid.

The di-acid esters are commercially available products. These commercial products can be cited, more particularly, as Rhodlasolv RPDE® marketed by Rhône-Poulenc and "Du Pont Dibasic Esters®" marketed by Du Pont de Nemours.

Examples of the second category of compound (b) can be cited as alkyleneglycol ethers. More particularly, the ether part has a carbon number of between 1 and 6 and can be aromatic or preferably aliphatic.

Examples of these compounds can be cited as ethyleneglycol methylether, diethyleneglycol ethylether, propyleneglycol methylether, dipropyleneglycol methylether, diethyleneglycol methylether, tripropyleneglycol methylether.

Compounds of this category are marketed, in particular, by Dow under the name DOWANOL®.

Here too, it is quite possible to envisage the use of a mixture of the two afore-mentioned categories of compound (b), without coming outside the scope of the present invention.

However, it is preferable if the composition according to the invention has, as compound (b), at least one product from the first category mentioned.

As stated hereinabove, the amount of compound (a), expressed by volume, varies between 1 and 99%, the complement up to 100% being made up by compound (b).

According to one particular embodiment of the invention, the amount of compound (a) is between 5 and 70%, the complement up to 100% being made up by compound (b).

One preferred embodiment of the invention consists in the use of a mixture of from 10 to 50% of compound (a).

Still more preferably, the composition according to the invention comprises 10% to 40% of compound (a), the complement up to 10% being made up by compound (b).

According to a particularly advantageous embodiment, the content of compound (a) is less than 50%, the complement being made up by compound (b).

The cleaning composition according to the present invention can also comprise various additives.

These additives may include anionic or non-ionic surfactants.

Examples of anionic surfactants are hydrosoluble salts of alkylsulphates, alkylethersulphates, alkylisethionates and alkyltaurates or their salts, alkylcarboxylates, alkylsulfosuccinates or alkylsuccinamates, alkylsarcosinates, alkylated derivatives of protein hydrolysates, acylaspartates, ester phosphates of alkyl and/or of alkylether and/or of alkylarylether; the cation being an alkali metal or alkaline earth metal (sodium, potassium, lithium, magnesium), an ammonium residue which is substituted or not (methyl-, dimethyl-, trimethyl-, tetramethylammonium, dimethylpiperidinium . . . ) or a derivative of an alcanolamine (monoethanolamine, diethanolamine, triethanolamine . . . ).

Examples of non-ionic surfactants can be given as polyoxyalkylene derivatives of aliphatic or arylaliphatic alcohols, fatty acids, triglycerides, sorbitan esters, fatty amines, alkylpolysaccharides having a $C_6$–$C_{30}$, preferably a $C_{10}$–$C_{16}$, hydrophobic group, and a polysaccharide group, e.g. polyglycoside, as the hydrophillic group and also 1 to 3 units of sugar, alkylated derivatives of amino-sugars, such as alkylglucamides produced by the amide formation reaction of a fatty acid on N-methylglucamine.

These surfactants can be used alone or in combination.

According to one particular embodiment, surfactants of the non-ionic type are used. Preferably, oxyalkylenated surfactants are used, that is to say those comprising oxyethylenated and/or oxypropylenated units.

The number of oxyethylene (OE) units and/or oxypropylene (OP) units in these non-ionic surfactants usually varies from 2 to 100, depending on the HLB (hydrophillic/lipophilic balance) desired. Preferably, the number of OE and/or OP units is between 2 and 50.

The ethoxylated or ethoxy-propoxylated fatty alcohols usually have from 6 to 22 carbon atoms, the OE and OP units being excluded from these numbers, and are preferably ethoxylated.

The ethoxylated or ethoxy-propoxylated triglycerides can be triglycerides of vegetable or animal origin. Thus, lard, suet, peanut oil, butter fat, cottonseed oil, linseed oil, olive oil, palm oil, grapeseed oil, fish oil, soya oil, castor oil, rapeseed oil, copra oil, coconut oil are suitable for the invention. These products are preferably ethoxylated.

In the present invention, the term, "ethoxylated triglyceride" refers both to products obtained by the ethoxylation of a triglyceride with ethylene oxide as well as those obtained by the trans-esterification of a triglyceride with a polyethyleneglycol.

The ethoxylated or ethoxy-propoxylated fatty acids are esters of fatty acids (e.g. oleic acid, stearic acid), and are preferably ethoxylated.

The ethoxylated or ethoxy-propoxylated esters of sorbitan are esters of sorbitol cyclised with $C_{10}$ to $C_{20}$ fatty acids such as lauric acid, stearic acid or oleic acid, and are preferably ethoxylated.

Similarly, the term, "ethoxylated fatty acid" includes both products obtained by ethoxylation of a fatty acid with ethylene oxide as well as those obtained by the esterification of a fatty acid with a polyethyleneglycol.

The ethoxylated or ethoxy-propoxylated fatty amines usually have 10 to 22 carbon atoms, the OE and OP units being excluded from these numbers, and they are preferably ethoxylated.

The ethoxylated or ethoxy-propoxylaied alkylphenols usually have 1 or 2 straight or branched alkyl groups having 4 to 12 carbon atoms, in particular octyl, nonyl or dodecyl.

Examples of non-ionic surfactants from the group formed by ethoxylated or ethoxy-propoxylated alkylphenols, ethoxylated di(1-phenylethyl)phenols and ethoxylated or ethoxy-propoxylated tri(1-phenylethyl) phenols are, in particular: di(1-phenylethyl)phenol ethoxylated with 5 OE units; di(1-phenylethyl)phenol ethoxylated with 10 OE units; tri(1-phenylethyl)phenol ethoxylated with 16 OE units; tri(1-phenylethyl)phenol ethoxylated with 20 OE units; tri(1-phenylethyl)phenol ethoxylated with 25 OE units; tri(1-phenylethyl)phenol ethoxylated with 40 OE units; tri(1-phenylethyl)phenols ethoxypropoxylated with 25 OE+OP units; nonylphenol ethoxylated with 2 OE units; nonylphenol ethoxylated with 4 OE units; nonylphenol ethoxylated with 6 OE units; nonylphenol ethoxylated with 9 OE units; nonylphenols ethoxypropoxylated with 25 OE+OP units; nonylphenols ethoxypropoxylated with 30 OE+OP units; nonylphenols ethoxypropoxylated with 40 OE+OP units; nonyiphenols ethoxypropoxylated with 55 OE+OP units; nonylphenols ethoxypropoxylated with 80 OE+OP units.

Usually, the content of an additive of the surfactant type is between 0.1 and 10% by volume in relation to the total volume of the composition. Preferably, this content is between 0.6% and 5%, by volume, in relation to the same reference.

The composition according to the invention can also comprise a thickening additive.

Conventional thickening agents can be used, such as cellulose derivatives (ethylcellulose, hydroxypropylcellulose), xanthane, guar or carob gums, alginates, polyacrylates, starches, modified starches and modified clays.

The content of thickening additive usually varies between 0.5% and 10% by volume in relation to the total volume of the composition. Preferably, the amount of thickening additive is between 1% and 3%.

The composition according to the invention can also comprise abrasive particles. In particular, it is possible to use aluminium oxide, silica, silicon carbide, tungsten carbide or silicon carbonitride based particles or a mixture thereof.

The quantity of abrasive particles varies greatly and is determined by the skilled person depending on the substrate to be treated.

The compositions according to the invention therefore allow any type of oil, grease or lubricant to be cleaned, whether of vegetable, mineral or animal origin.

The type of substrate to be cleaned can vary greatly. Thus, the composition according to the invention permits metals and their alloys to be treated, such as steel, stainless steel, aluminium, copper, iron, but also plastics materials and inorganic glasses. The present invention is also suitable for cleaning printed circuits, without any risk of said substrate being destroyed.

The cleaning process which employs the composition according to the invention consists in contacting the substrate to be cleaned with said composition. This contacting is carried out in accordance with conventional methods, such as aspersion or immersion with or without agitation.

The cleaning operation can be carried out either hot or cold. Thus, temperatures in the order of 5° to 80° C., and even above, are suitable for the operation. It should be noted that the composition of the invention is very advantageous in that it is inflammable. Thus, it is possible to operate safely at relatively high temperatures.

The contact time between the support and composition varies greatly and depends on the type of grease which is to be removed. However, by way of example, the contact time is between a few seconds and 60 minutes.

The composition of the present invention permits complete de-greasing of the substrate.

Once contact has taken place, the substrate is rinsed in water.

Another advantage of the composition according to the invention, and more particularly of the composition comprising up to 40% by volume of compound (a) is the fact that it is soluble in the greases which are to be removed. In fact, the solubility of the oils in this composition when hot is much greater than the solubility when cold. Consequently, the object which is to be cleaned is initially contacted with the composition according to the invention when hot which is advantageous since the degreasing capacity of the composition is very high in this case. Then, once the composition is saturated with oil or contains a substantial amount of oil, the bath containing the composition and said greases simply has to be cooled in order to bring about separation of the phases. Thus, recycling of the composition is facilitated because one simple decanting operation is sufficient followed by a separation step for the purpose of recovering the composition according to the invention for re-use in a new cleaning operation.

Some concrete but non-limitative examples of the invention will now be described.

EXAMPLE 1

This example illustrates the degreasing at ambient temperature of a paraffin oil (Total 200 Nutral®) whose composition comprises 2,4-diphenyl-2-methylpentane.

The degreasing composition is as follows (% by volume):
50% 2,4-diphenyl, 2-methylpentane,
50% RPDE;
2% nonylphenol 10 OE (in relation to the total volume of compounds (a) and (b)).

The present composition allows up to 50% by weight of paraffin oil Total 200 Neutral® to be solubilised.

The substrate used is a steel plate (type R Q-panel) which has been cleaned beforehand. In order to be covered in grease, the plate is immersed in oil for two minutes, and is then stored for 8 hours.

The greased plate is then immersed in the afore-described cleaning composition for 15 seconds at ambient temperature. This is the time required to completely remove the paraffin oil from the plate.

The solvent film is then removed by rinsing in a stream of running water for 20 seconds over each face (flow rate: 2 l/min, temperature: 17° C.).

The cleanliness of the plate is assessed using the Water Break Test, ASTM F22-85, 1992).

The mark given was 4 (on a scale of 0 to 4) which means that no residual trace of organic compound (composition and oil) remained.

It is therefore noted that the composition according to the invention has a very high oil solubilisation capacity, that it has a very good degreasing strength, and that the solvent film can be removed quickly and efficiently.

EXAMPLE 2

This example illustrates the degreasing of a plate when hot which has paraffin oil (Total 200 Neutral®) whose composition comprises 2,4-diphenyl-2-methylpentane.

The degreasing composition is as follows (% by volume):
30% 2,4-diphenyl, 2-methylpentane,
70% RPDE,
2% nonylphenol with 10 OE (in relation to the total volume of compounds (a) and (b)).

The mode of operation described in Example 1 is reproduced, apart from the fact that immersion takes place at 60° C.

The necessary immersion time for obtaining complete degreasing of the plate is 15 seconds.

The composition permits solubilisation at that temperature of up to 50%, by weight, at 60° C. and of 5%, by weight, of oil at ambient temperature. This low solubility when cold facilitates recycling of the composition after separation of the phases.

It is therefore noted that the composition according to the invention has a very good degreasing strength and that the solvent film can be removed very quickly and effectively. Moreover, its oil solubilisation capacity is variable depending on the temperature, so that it is possible to solubilise large quantities when hot and also to perform recycling easily by separation of the phases when cold.

What is claimed is:

1. A cleaning composition, comprising:
   1% to 99% by volume of at least one compound (a) having an aliphatic hydrocarbon chain substituted by at least two aryl or alkylaryl radicals, the aromatic nucleus of at least two aryl or alkylaryl radicals having 6 carbon atoms; and
   99% to 1% by volume of at least one polar aprotic compound (b) which is an alkyleneglycol ether at least partly soluble in water and in compound (a).

2. A composition according to claim 1, wherein the content of compound (a) is between 5% and 70%.

3. A composition according to claim 2, wherein the content of compound (a) is between 10% and 50%.

4. A composition according to claim 3, wherein the content of compound (a) is between 10% and 40%.

5. A composition according to claim 1, wherein the compound (a) has a hydrocarbon aliphatic chain comprising 3 to 12 carbon atoms.

6. A composition according to claim 5, wherein said aliphatic chain comprises 4 to 10 carbon atoms.

7. A composition according to claim 1, wherein the compound (a) comprises at least two aryl type radicals.

8. A composition according to claim 1, wherein the compound (a) is 2,4-diphenyl 2-methylpentane.

9. A composition according to claim 1, wherein the compound (a) is 2,4-diphenyl-2-methyl pent-3-ene.

10. A composition according to claim 1, further comprising between 0.1% and 10% by weight of at least one non-ionic or anionic surfactant.

11. A composition according to claim 10, wherein the non-ionic surfactant is selected from the group consisting of ethoxylated alkylphenols, ethoxy-propoxylated alkylphenols, ethoxylated fatty alcohols and ethoxy-propoxylated fatty alcohols.

12. A composition according to claim 10, further comprising from 0.5% to 10% by weight of a thickening agent.

13. A composition according to claim 12, further comprising abrasive particles.

14. A cleaning composition, comprising:

1% to 99% by volume of at least one compound (a) having an aliphatic hydrocarbon chain substituted by at least two aryl or alkylaryl radicals, the aromatic nucleus of at least two aryl or alkylaryl radicals having 6 carbon atoms; and 99% to 1% by volume of at least one polar aprotic compound (b) which is a $C_1$–$C_4$ dialkyl ester of at least one $C_4$–$C_6$ aliphatic di-acid at least partly soluble in water and in compound (a).

15. A composition according to claim 14, wherein the content of compound (a) is between 5% and 70%.

16. A composition according to claim 15, wherein the content of compound (a) is between 10% and 50%.

17. A composition according to claim 16, wherein the content of compound (a) is between 10% and 40%.

18. A composition according to claim 14, wherein the compound (a) has a hydrocarbon aliphatic chain comprising 3 to 12 carbon atoms.

19. A composition according to claim 18, wherein said aliphatic chain comprises 4 to 10 carbon atoms.

20. A composition according to claim 14, wherein the compound (a) comprises at least two aryl type radicals.

21. A composition according to claim 14, wherein the compound (a) is 2,4-diphenyl 2-methylpentane.

22. A composition according to claim 14, wherein the compound (a) is 2,4-diphenyl-2-methyl pent-3-ene.

23. A composition according to claim 14, further comprising between 0.1% and 10% by weight of at least one non-ionic or anionic surfactant.

24. A composition according to claim 23, wherein the non-ionic surfactant is selected from the group consisting of ethoxylated alkylhenols, ethoxy-propoxylated alkylphenols, ethoxylated fatty alcohols and ethoxy-propoxylated fatty alcohols.

25. A composition according to claim 23, further comprising from 0.5% to 10% by weight of a thickening agent.

26. A composition according to claim 25, further comprising abrasive particles.

* * * * *